US012142615B2

(12) United States Patent
Wang et al.

(10) Patent No.: US 12,142,615 B2
(45) Date of Patent: Nov. 12, 2024

(54) ELECTRONIC DEVICE

(71) Applicant: E Ink Holdings Inc., Hsinchu (TW)

(72) Inventors: Yu-Lin Wang, Hsinchu (TW); Wei-Tsung Chen, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 439 days.

(21) Appl. No.: 17/657,632

(22) Filed: Apr. 1, 2022

(65) Prior Publication Data

US 2022/0344378 A1 Oct. 27, 2022

Related U.S. Application Data

(60) Provisional application No. 63/178,539, filed on Apr. 23, 2021.

(51) Int. Cl.
*H01L 27/12* (2006.01)
*H01L 29/786* (2006.01)

(52) U.S. Cl.
CPC ...... *H01L 27/1244* (2013.01); *H01L 27/1225* (2013.01); *H01L 27/124* (2013.01); *H01L 27/1248* (2013.01); *H01L 29/7869* (2013.01)

(58) Field of Classification Search
CPC ... H01L 27/124; H01L 27/1248; H01L 29/45; H01L 29/4908
See application file for complete search history.

(56) References Cited

U.S. PATENT DOCUMENTS

| 4,420,504 A | 12/1983 | Cooper et al. |
| 6,407,780 B1 | 6/2002 | Sung |
| 7,411,298 B2 | 8/2008 | Kawakami et al. |
| 8,742,418 B2 | 6/2014 | Morosawa et al. |
| 9,536,908 B2 | 1/2017 | Chung et al. |
| 9,859,437 B2 | 1/2018 | Morosawa et al. |
| 10,403,653 B2 | 9/2019 | Fujita et al. |
| 10,437,125 B2 | 10/2019 | Oh et al. |
| 10,691,241 B2 | 6/2020 | Kim et al. |
| 10,804,406 B2 | 10/2020 | Misaki |
| 2014/0175432 A1 | 6/2014 | Yamazaki et al. |

(Continued)

FOREIGN PATENT DOCUMENTS

| CN | 1534362 A | 10/2004 |
| CN | 101304023 A | 11/2008 |

(Continued)

OTHER PUBLICATIONS

The office action of corresponding CN No. 202210348942.3 application issued on Apr. 26, 2024.

(Continued)

*Primary Examiner* — Jaehwan Oh
(74) *Attorney, Agent, or Firm* — CKC & Partners Co., LLC (57) ABSTRACT

An electronic device includes a substrate, a first wiring layer, an oxide insulating layer and a nitride insulating layer. The first wiring layer is disposed on the substrate and includes an outer metal layer. The outer metal layer contains at least 97 wt % molybdenum. The oxide insulating layer is disposed on the first wiring layer and touches the outer metal layer. The nitride insulating layer is disposed on the oxide insulating layer, where the thickness difference between the thickness of the oxide insulating layer and the thickness of the nitride insulating layer is greater than or equal to 250 nm.

17 Claims, 7 Drawing Sheets

(56) References Cited

U.S. PATENT DOCUMENTS

| | | | |
|---|---|---|---|
| 2014/0362324 | A1 | 12/2014 | Yamazaki et al. |
| 2015/0187948 | A1 | 7/2015 | Misaki |
| 2015/0295092 | A1 | 10/2015 | Misaki |
| 2017/0186777 | A1* | 6/2017 | Toyotaka ............... H01L 27/124 |
| 2019/0333461 | A1* | 10/2019 | Kikuchi ............... H01L 29/7869 |
| 2019/0362683 | A1* | 11/2019 | Ikeda .................... H01L 27/124 |
| 2020/0124891 | A1 | 4/2020 | Uchida |
| 2020/0127011 | A1* | 4/2020 | Yamazaki ............. G02F 1/1368 |
| 2021/0119007 | A1 | 4/2021 | Misaki |
| 2021/0294138 | A1* | 9/2021 | Kitagawa ............ H01L 27/1251 |
| 2023/0420423 | A1* | 12/2023 | Kim .................... H01L 25/0753 |

FOREIGN PATENT DOCUMENTS

| | | |
|---|---|---|
| CN | 102347335 A | 2/2012 |
| CN | 102386071 A | 3/2012 |
| CN | 102576732 A | 7/2012 |
| CN | 103855030 A | 6/2014 |
| CN | 104570522 A | 4/2015 |
| CN | 104752441 A | 7/2015 |
| CN | 105051596 A | 11/2015 |
| CN | 105074934 A | 11/2015 |
| CN | 106887436 A | 6/2017 |
| CN | 111244110 A | 6/2020 |
| CN | 111403337 A | 7/2020 |
| CN | 111554694 A | 8/2020 |
| JP | H03152807 A | 6/1991 |
| KR | 20120063809 A | 6/2012 |
| TW | 201322459 A | 6/2013 |
| TW | 202115868 A | 4/2021 |

OTHER PUBLICATIONS

The office action of corresponding TW application No. 111112762 issued on Mar. 6, 2023.

The office action of corresponding CN application No. 202210348347.X issued on May 24, 2023.

The office action of corresponding TW application issued on Sep. 6, 2023.

* cited by examiner

ELECTRONIC DEVICE

CROSS-REFERENCE TO RELATED APPLICATION

This application claims priority to U.S. Provisional Application Ser. No. 63/178,539, filed Apr. 23, 2021, which is herein incorporated by reference in its entirety.

BACKGROUND

Technical Field

The present disclosure relates to an electronic device. More particularly, the present disclosure relates to an electronic device including an insulating layer and a nitride insulating layer.

Description of Related Art

Some current electronic devices, such as displays, have wiring layers for the transmission of electrical signals, so that the electronic devices can work, for example, displaying images. An insulating layer usually covers the wiring layer and thus can protect the wiring layer. However, the bonding strength between the insulating layer and the wiring layer sometimes becomes weak under the influence of processes or material features, so that the insulating layer peels from the wiring layer easily. Therefore, not only the wiring layer is not under protection, but also the peeling of the insulating layer can damage the wiring layer easily.

SUMMARY

The disclosure provides an electronic device which can reduce the chance of or prevent the peeling of the insulating layer.

An electronic device according to at least one embodiment of the disclosure includes a substrate, a first wiring layer, an oxide insulating layer and a nitride insulating layer. The first wiring layer including an outer metal layer is disposed on the substrate, in which the outer metal layer contains at least 97 wt % (percentage by weight) molybdenum. The oxide insulating layer is disposed on the first wiring layer and touches the outer metal layer. The nitride insulating layer is disposed on the oxide insulating layer, in which the oxide insulating layer is positioned between the nitride insulating layer and the outer metal layer. A thickness difference between the thickness of the oxide insulating layer and the thickness of the nitride insulating layer is greater than or equal to 250 nm.

Based on the above, in the condition that the thickness difference between the thickness of the oxide insulating layer and the thickness of the nitride insulating layer is greater than or equal to 250 nm, a sufficient bonding strength can be generated between the oxide insulating layer and the first wiring layer, so as to reduce the chance of or prevent the peeling of the oxide insulating layer and the nitride insulating layer.

These and other features, aspects, and advantages of the present disclosure will become better understood with reference to the following description and appended claims.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Reference will now be made in detail to the present embodiments of the disclosure, examples of which are illustrated in the accompanying drawings. Wherever possible, the same reference numbers are used in the drawings and the description to refer to the same or like parts.

In the following description, in order to clearly present the technical features of the present disclosure, the dimensions (such as length, width, thickness, and depth) of elements (such as layers, films, substrates, and areas) in the drawings will be enlarged in unusual proportions, and the quantity of some elements will be reduced. Accordingly, the description and explanation of the following embodiments are not limited to the quantity, sizes and shapes of the elements presented in the drawings, but should cover the sizes, shapes, and deviations of the two due to actual manufacturing processes and/or tolerances. For example, the flat surface shown in the drawings may have rough and/or non-linear characteristics, and the acute angle shown in the drawings may be round. Therefore, the elements presented in the drawings in this case which are mainly for illustration are intended neither to accurately depict the actual shape of the elements nor to limit the scope of patent applications in this case.

Moreover, the words, such as "about", "approximately", or "substantially", appearing in the present disclosure not only cover the clearly stated values and ranges, but also include permissible deviation ranges as understood by those with ordinary knowledge in the technical field of the invention. The permissible deviation range can be caused by the error generated during the measurement, where the error is caused by such as the limitation of the measurement system or the process conditions. In addition, "about" may be expressed within one or more standard deviations of the values, such as within ±30%, ±20%, ±10%, or ±5%. The word "about", "approximately" or "substantially" appearing in this text can choose an acceptable deviation range or a standard deviation according to optical properties, etching properties, mechanical properties or other properties, not just one standard deviation to apply all the optical properties, etching properties, mechanical properties and other properties.

Figure 1:
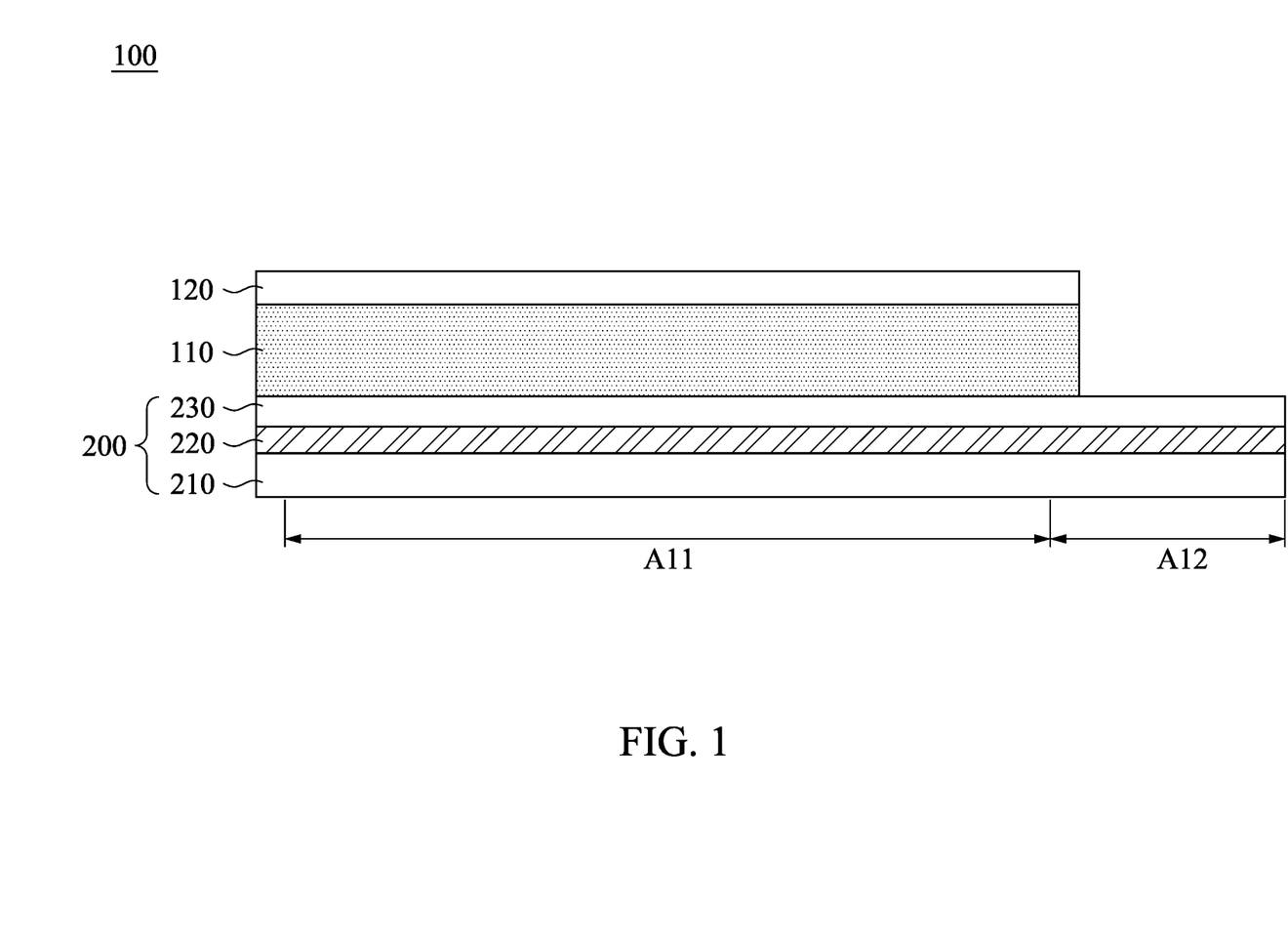
FIG. 1 is a schematic cross-sectional view of an electronic device according to at least one embodiment of this disclosure.

FIG. 1 is a schematic cross-sectional view of an electronic device according to at least one embodiment of this disclosure. Referring to FIG. 1, the electronic device 100 of the embodiment may be a display device, and FIG. 1 simply depicts the structure of the electronic device 100. Specifically, the electronic device 100 can include a control substrate 200, an imaging part 110 and an opposite substrate 120. The control substrate 200 includes a substrate 210, a component-array layer 220 and a passivation layer 230, in which the component-array layer 220 is disposed between the substrate 210 and the passivation layer 230.

The imaging part 110 is disposed on the passivation layer 230, and the opposite substrate 120 is disposed on the imaging part 110, so the imaging part 110 is positioned between the control substrate 200 and the opposite substrate 120. The electronic device 100 has a display area A11 and a non-display area A12, in which the non-display area A12 is located at the peripheral area around the display area A11. The imaging part 110 is distributed in the whole display area A11 and the part of the non-display area A12, not distributed in most of the non-display area A12.

The electronic device 100 can be a liquid crystal display (LCD) panel, an electrowetting display panel, an electrophoretic display (EPD) panel, an organic light-emitting diode (OLED) display panel or a light-emitting diode (LED) display panel. Hence, the imaging part 110 can include a liquid crystal layer, an electrowetting layer, electrophoretic ink, a plurality of OLEDs or a plurality of LEDs, in which the LED may be a micro-LED (μLED) or a mini-LED.

When the electronic device 100 is an LCD panel, the opposite substrate 120 can be a color filter substrate, and the substrate 210 can be a transparent substrate, such as a glass plate or a transparent polymer substrate. When the electronic device 100 is the OLED display panel or the LED display panel, the opposite substrate 120 can be a transparent substrate, such as a glass plate, and the substrate 210 can be an opaque wiring substrate.

Figure 2A:
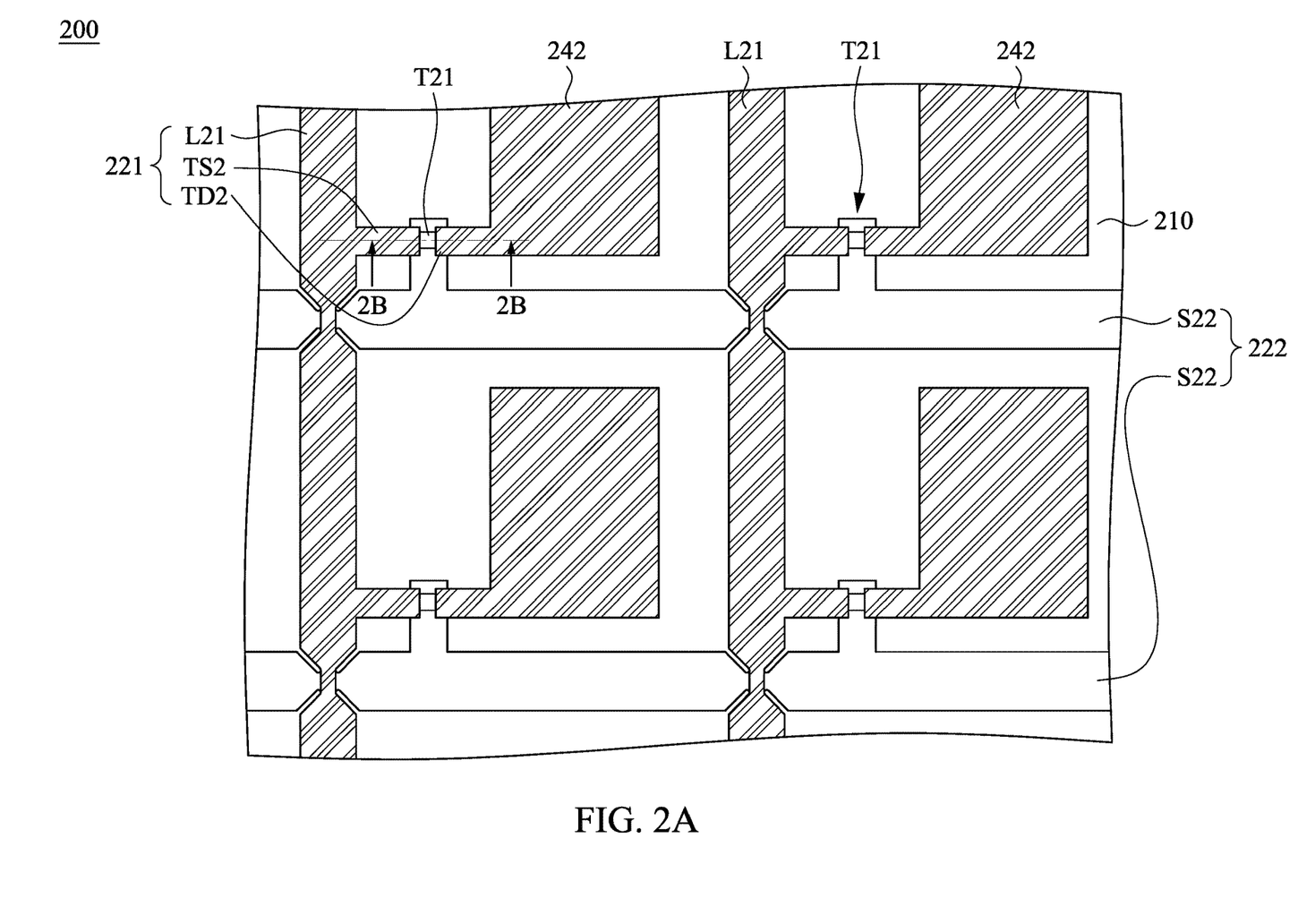
FIG. 2A is a schematic top view of the control substrate within the display area in FIG. 1.
Figure 2B:
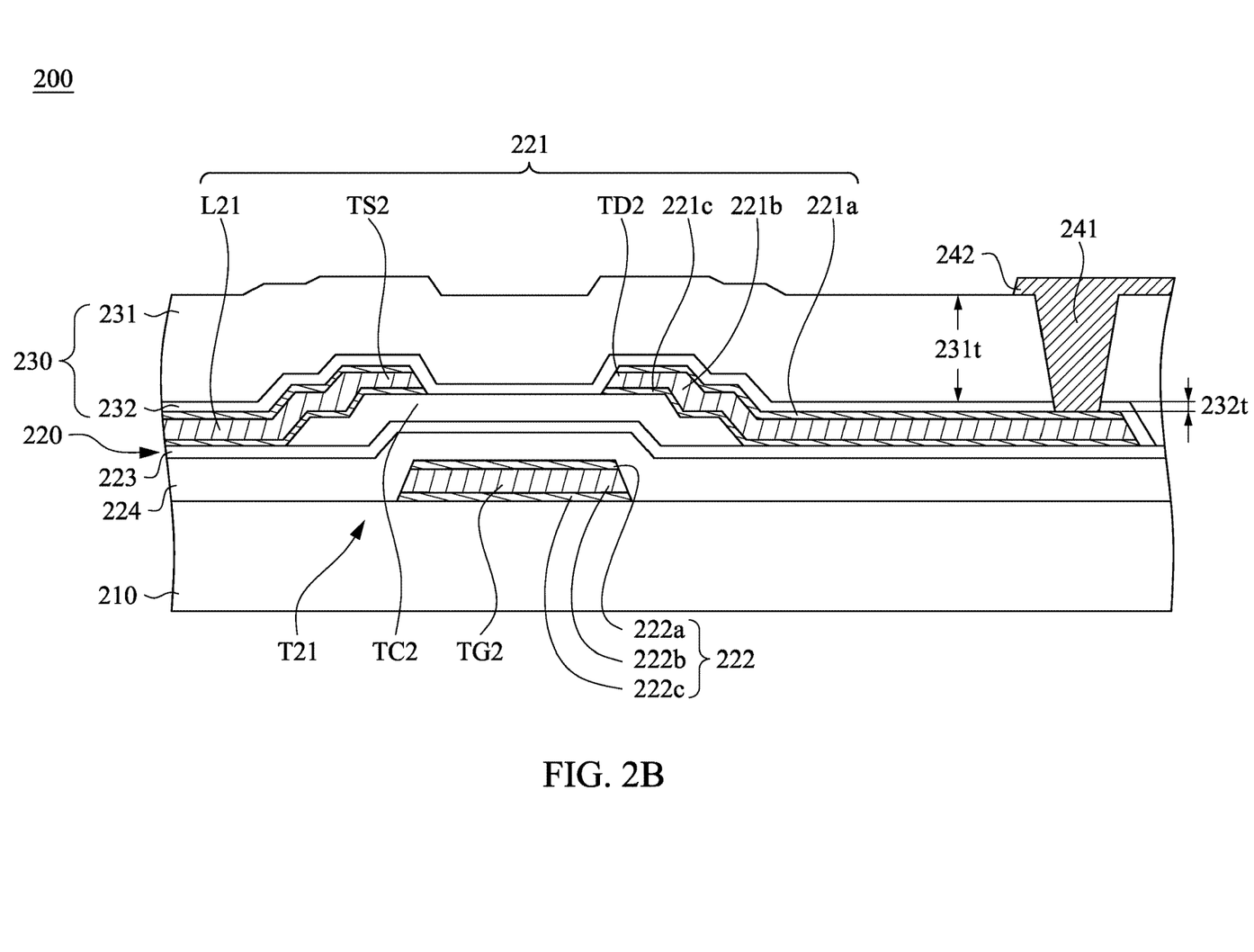
FIG. 2B is a schematic cross-sectional view along a line 2B-2B shown in FIG. 2A.

FIG. 2A is a schematic top view of the control substrate within the display area in FIG. 1, and FIG. 2B is a schematic cross-sectional view along a line 2B-2B shown in FIG. 2A, where FIG. 2A depicts the control substrate 200 in the absence of the passivation layer 230. Referring to FIGS. 2A and 2B, the component-array layer 220 includes a first wiring layer 221 disposed on the substrate 210, in which the first wiring layer 221 is distributed in the display area A11 (referring to FIG. 1).

The first wiring layer 221 has a multilayer structure. Taking FIG. 2B for example, the first wiring layer 221 can include an outer metal layer 221a, a first inner metal layer 221c and a second inner metal layer 221b, in which the first inner metal layer 221c is disposed on the substrate 210, and the second inner metal layer 221b is disposed between the first inner metal layer 221c and the outer metal layer 221a.

The second inner metal layer 221b can touch the first inner metal layer 221c and the outer metal layer 221a, in which the material of the second inner metal layer 221b is different from the material of the outer metal layer 221a. Specifically, the outer metal layer 221a which is a molybdenum layer or a molybdenum chromium alloy layer contains at least 97 wt % molybdenum. The second inner metal layer 221b is the metal layer containing no molybdenum. For example, the second inner metal layer 221b may be an aluminum layer. The material of the first inner metal layer 221c can be the same as the material of the outer metal layer 221a. For example, the first inner metal layer 221c also can be the molybdenum layer or the molybdenum chromium alloy layer, and contain at least 97 wt % molybdenum.

The passivation layer 230 includes a nitride insulating layer 231 and an oxide insulating layer 232. The oxide insulating layer 232 may be a silicon oxide layer, whereas the nitride insulating layer 231 may be a silicon nitride layer.

The oxide insulating layer 232 is disposed on the first wiring layer 221 and touches both the outer metal layer 221a and the nitride insulating layer 231. The nitride insulating layer 231 is disposed on the oxide insulating layer 232, so the oxide insulating layer 232 can be positioned between the nitride insulating layer 231 and the outer metal layer 221a. In addition, the imaging part 110 (shown in FIG. 1) is disposed on the nitride insulating layer 231, so that the nitride insulating layer 231 is positioned between the imaging part 110 and the oxide insulating layer 232.

The thickness difference between the thickness 232t of the oxide insulating layer 232 and the thickness 231t of the nitride insulating layer 231 is greater than or equal to 250 nm, that is, the absolute difference between the thickness 232t and the thickness 231t is greater than or equal to 250 nm. For example, the thickness 232t of the oxide insulating layer 232 can be less than or equal to 50 nm, and the thickness 231t of the nitride insulating layer 231 can be greater than or equal to 300 nm. Alternatively, the thickness 231t of the nitride insulating layer 231 can be less than or equal to 50 nm, and the thickness 232t of the oxide insulating layer 232 can be greater than or equal to 300 nm.

When the thickness difference between the thickness 232t of the oxide insulating layer 232 and the thickness 231t of the nitride insulating layer 231 is greater than or equal to 250 nm, a stronger bonding strength can be generated between the passivation layer 230 and the first wiring layer 221. For example, the passivation layer 230 can pass cross cut adhesion test when the thickness 232t is about 50 nm, and the thickness 231t is about 300 nm; alternatively, the thickness 231t is about 50 nm, and the thickness 232t is about 300 nm.

Even if 3 M™ super bond film tape 396 is used for the cross cut adhesion test, the oxide insulating layer 232 and the nitride insulating layer 231 basically cannot peel off, thereby reaching the level which is equivalent to 5B according to ASTM standard. Therefore, in the condition that the thickness difference between the thicknesses 232t and 231t is greater than or equal to 250 nm, the stronger bonding strength can be generated between the passivation layer 230 and the first wiring layer 221 indeed, so as to reduce the chance of or prevent the peeling of the passivation layer 230, thereby reducing the chance of or prevent the damage of the first wiring layer 221 caused by the passivation layer 230 peeling off.

The component-array layer 220 of the electronic device 100 further includes a second wiring layer 222 and insulating layers 223 and 224. The second wiring layer 222 is disposed on the substrate 210 and positioned between the substrate 210 and the first wiring layer 221. The insulating layers 223 and 224 positioned between the first wiring layer 221 and the second wiring layer 222 cover the substrate 210 and the second wiring layer 222 completely. The insulating layer 223 can touch the first wiring layer 221, while the insulating layer 224 can touch the second wiring layer 222, where the insulating layer 224 is positioned between the insulating layer 223 and the substrate 210. In addition, the material of the insulating layer 223 can be silicon oxide, whereas the material of the insulating layer 224 can be silicon nitride.

The second wiring layer 222 also can have a multilayer structure. For example, the second wiring layer 222 can include three metal layers 222a, 222b and 222c, in which the metal layer 222b positioned between the metal layers 222a and 222c can touch the metal layers 222a and 222c, and the metal layer 222c can touch the substrate 210. Both the material and the structure of the second wiring layer 222 can be the same as both the material and the structure of the first wiring layer 221. The metal layers 222a and 222c which can be molybdenum layers or molybdenum chromium alloy layers contain at least 97 wt % molybdenum. The metal layer 222b can be the metal layer containing no molybdenum, which is aluminum layer, for example.

It is noted that in the embodiment, the component-array layer 220 includes two insulating layers 223 and 224, but in other embodiment, the component-array layer 220 can include only one insulating layer. For example, the insulating layer 224 in FIG. 2B can be omitted, and the thickness of the insulating layer 223 can increase, so that the insulating layer 223 can cover both the substrate 210 and the second wiring layer 222 completely and touch the first wiring layer 221 and the second wiring layer 222.

The component-array layer 220 further includes a plurality of semiconductor layers TC2. These semiconductor layers TC2 are disposed on the insulating layer 223. Each of the semiconductor layers TC2 can be made of indium gallium zinc oxide (IGZO), polycrystalline silicon (i.e., polysilicon) or monocrystalline silicon. The semiconductor layers TC2 and the second wiring layer 222 overlap. The first wiring layer 221 partially covers each of the semiconductor layers TC2 and is electrically connected to these semiconductor layers TC2. The component-array layer 220 can have a plurality of transistors T21, where the transistors T21 are thin film transistors (TFTs) made of the first wiring layer 221, the second wiring layer 222, the insulating layer 223, 224 and these semiconductor layers TC2.

Specifically, the first wiring layer 221 can include a plurality of sources TS2 and a plurality of drains TD2, whereas the second wiring layer 222 can include a plurality of gates TG2. These gates TG2 and these semiconductor layers TC2 overlap respectively, in which the insulating layers 223 and 224 are positioned between the gates TG2 and the semiconductors layers TC2, so that a capacitance can be generated between the gate TG2 and the semiconductor layer TC2.

Both these sources TS2 and these drains TD2 are positioned on these semiconductor layers TC2 and electrically connected to these semiconductor layers TC2 respectively. The source TS2 and the drain TD2 which are adjacent to each other are adjacent to and connected to two opposite sides of one of the semiconductor layers TC2. Accordingly, these transistors T21 can be made, where each of the transistors T21 has a source TS2, a drain TD2, a gate TG2 and a semiconductor layer TC2.

It is worth particularly mentioning that in the embodiment shown in FIG. 2B, the transistor T21 is a bottom gate TFT. In other embodiment, the transistor T21 also can be a top gate TFT. Hence, the transistors T21 is not limited to the bottom gate TFT.

Furthermore, as seen from FIG. 2B, the semiconductor layer TC2 is sandwiched between the oxide insulating layer 232 and the insulating layer 223, where both the oxide insulating layer 232 and the insulating layer 223 can be made of silicon oxide. When the semiconductor layer TC2 is made of IGZO, IGZO easily loses its semiconductor characteristic under the influence of nitride, so that both the oxide insulating layer 232 and the insulating layer 223 which the semiconductor layer TC2 is sandwiched between can protect the semiconductor layer TC2 from nitride (e.g., the insulating layer 223 and the nitride insulating layer 231). As a result, the semiconductor layer TC2 can remain its original semiconductor characteristic.

The control substrate 200 can further include a plurality of contact windows 241 (where FIG. 2B depicts only one contact window 241) and a plurality of electrodes 242. These electrodes 242 positioned on the nitride insulating layer 231 are electrically connected to these contact windows 241 respectively, and the imaging part 110 (referring to FIG. 1) covers these electrodes 242. These contact windows 241 are substantially conductive pillars and formed in the passivation layer 230. Each of the contact windows 241 passes through the passivation layer 230 and is connected to the drain TD2, so that these drains TD2 can be electrically connected to these electrodes 242 via these contact windows 241.

The first wiring layer 221 can further include a plurality of data lines L21, whereas the second wiring layer 222 can further include a plurality of scan lines S22. The data lines L21 are connected to the sources TS2, and the scan lines S22 are connected to the gates TG2. Accordingly, the signals transmitted by the scan lines S22 can be transmitted to the gates TG2, so as to switch the transistors T21 on or off, thereby controlling the input of the pixel signals transmitted by the data lines L21 to the electrodes 242 via the data lines L21. As a result, the pixel signals can be inputted to the imaging part 110, such as the liquid crystal layer, the electrowetting layer, the electrophoretic Ink, the OLED layer or the LEDs, thereby enabling the electronic device 100 to display images.

Figure 3A:
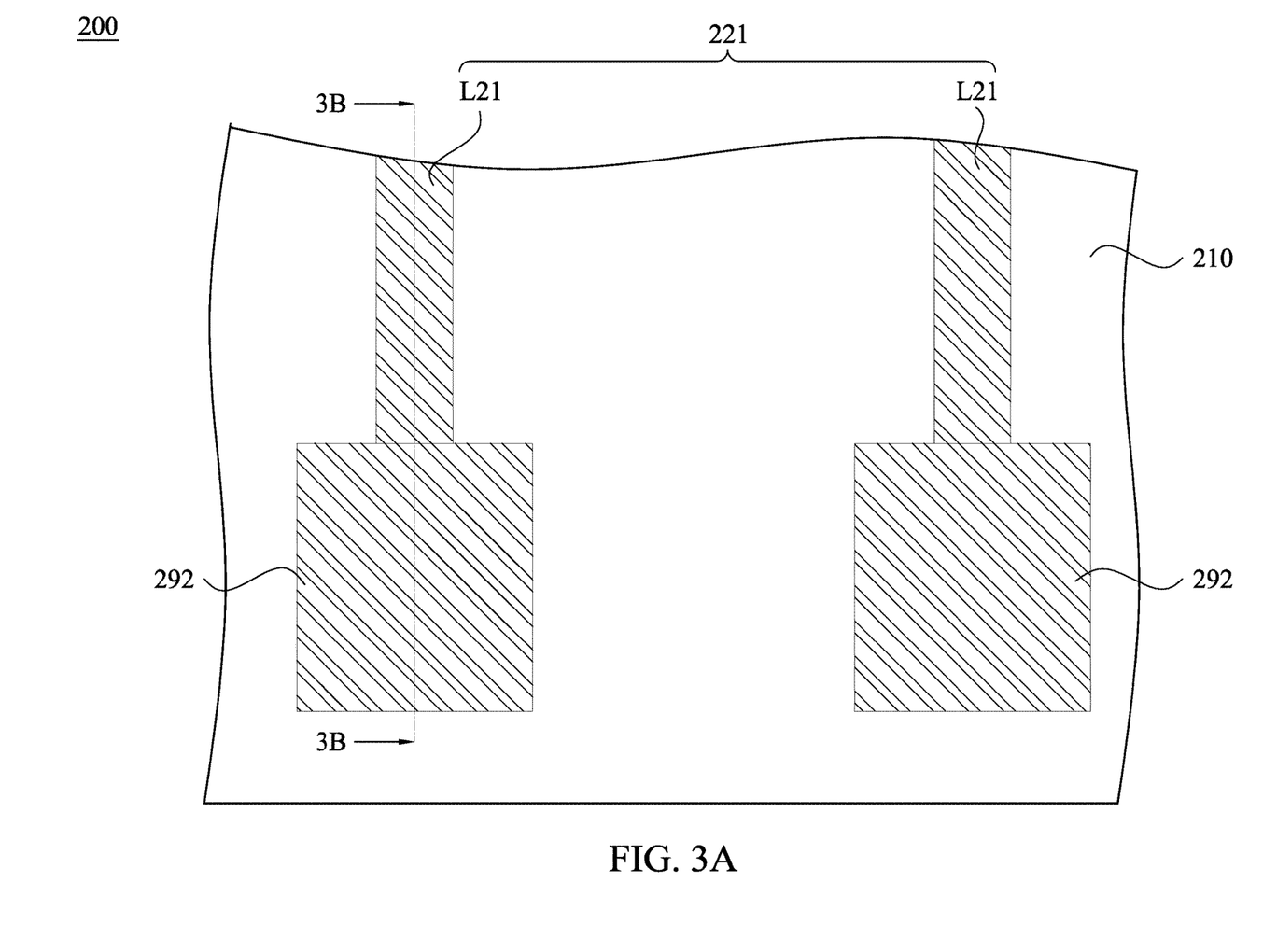
FIG. 3A is a schematic top view of the control substrate within the non-display area in FIG. 1.
Figure 3B:
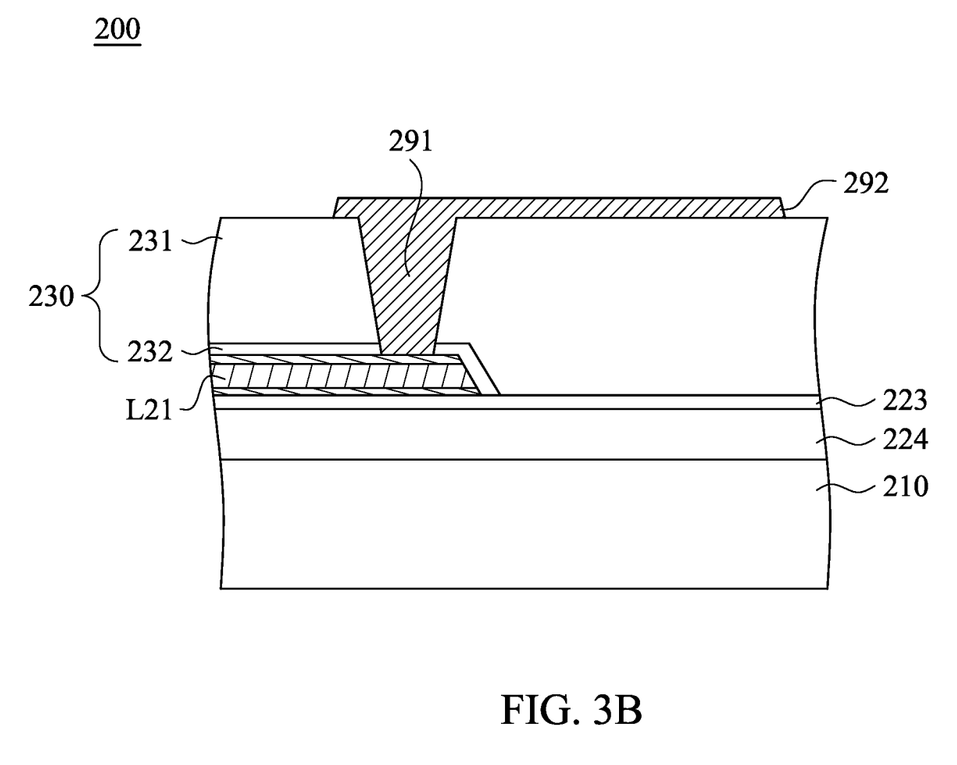
FIG. 3B is a schematic cross-sectional view along a line 3B-3B shown in FIG. 3A.

FIG. 3A is a schematic top view of the control substrate within the non-display area in FIG. 1, and FIG. 3B is a schematic cross-sectional view along a line 3B-3B shown in FIG. 3A, where FIG. 3A depicts the control substrate 200 in the absence of the passivation layer 230. Referring to FIGS. 3A and 3B, the component-array layer 220 can further include a plurality of contact windows 291 and a plurality of bonding pads 292, where the bonding pads 292 are electrically connected to the contact windows 291 respectively.

The bonding pads 292 are disposed on the nitride insulating layer 231 and distributed in the non-display area A12 (referring to FIG. 1). The imaging part 110 does not cover any bonding pads 292, so that the bonding pads 292 can be electrically connected to an external electronic component (not shown). For example, the bonding pads 292 can be electrically connected to a wiring substrate with solder or anisotropic conductive film (ACF). Hence, the chip mounted on the wiring substrate can be electrically connected to the bonding pads 292, in which the wiring substrate can be a flexible printed circuit (FPC), and the chip can be a source driver.

The first wiring layer 221 is further distributed in the non-display area A12 (referring to FIG. 1), where the data lines L21 extend from the display area A11 to the non-display area A12. The contact window 291 can be a conductive pillar substantially and formed in the passivation layer 230, in which each of the contact windows 291 passes through the passivation layer 230 and is connected to the data line L21, so that the bonding pads 292 are electrically connected to the data lines L21 of the first wiring layer 221. Accordingly, the chip (e.g., source driver) can input the pixel signals from the bonding pads 292 to the data lines L21, so that the data lines L21 can transmit the pixel signals to the transistors T21 and thus the pixel signals can be inputted to the electrodes 242.

Since the stronger bonding strength can be generated between the passivation layer 230 and the first wiring layer 221 indeed in the condition that the thickness difference between the thicknesses 232t and 231t is greater than or equal to 250 nm, the passivation layer 230 within the non-display area A12 peels off difficultly or does not peel off. Hence, In the process of electrically connecting the external electronic component (e.g., a wiring substrate mounted with a chip) and the bonding pads 292, the whole passivation layer 230 substantially remains and thus protects the first wiring layer 221, thereby reducing the chance of or preventing the damage of the first wiring layer 221 within the non-display area A12 caused by the passivation layer 230 peeling off.

It is worth mentioning that in the above embodiment, the oxide insulating layer 232 partially covers the insulating layer 223. Referring to FIGS. 2B and 3B, the oxide insulating layer 232 covers the component-array layer 220, but does not cover the part of the insulating layer 223, so that the nitride insulating layer 231 can cover and touch the insulating layer 223. Hence, the oxide insulating layer 232 does not completely cover the component-array layer 220. However, in other embodiment, the oxide insulating layer 232 also can completely cover the component-array layer 220, i.e., the oxide insulating layer 232 can completely cover the insulating layer 223.

Figure 4A:
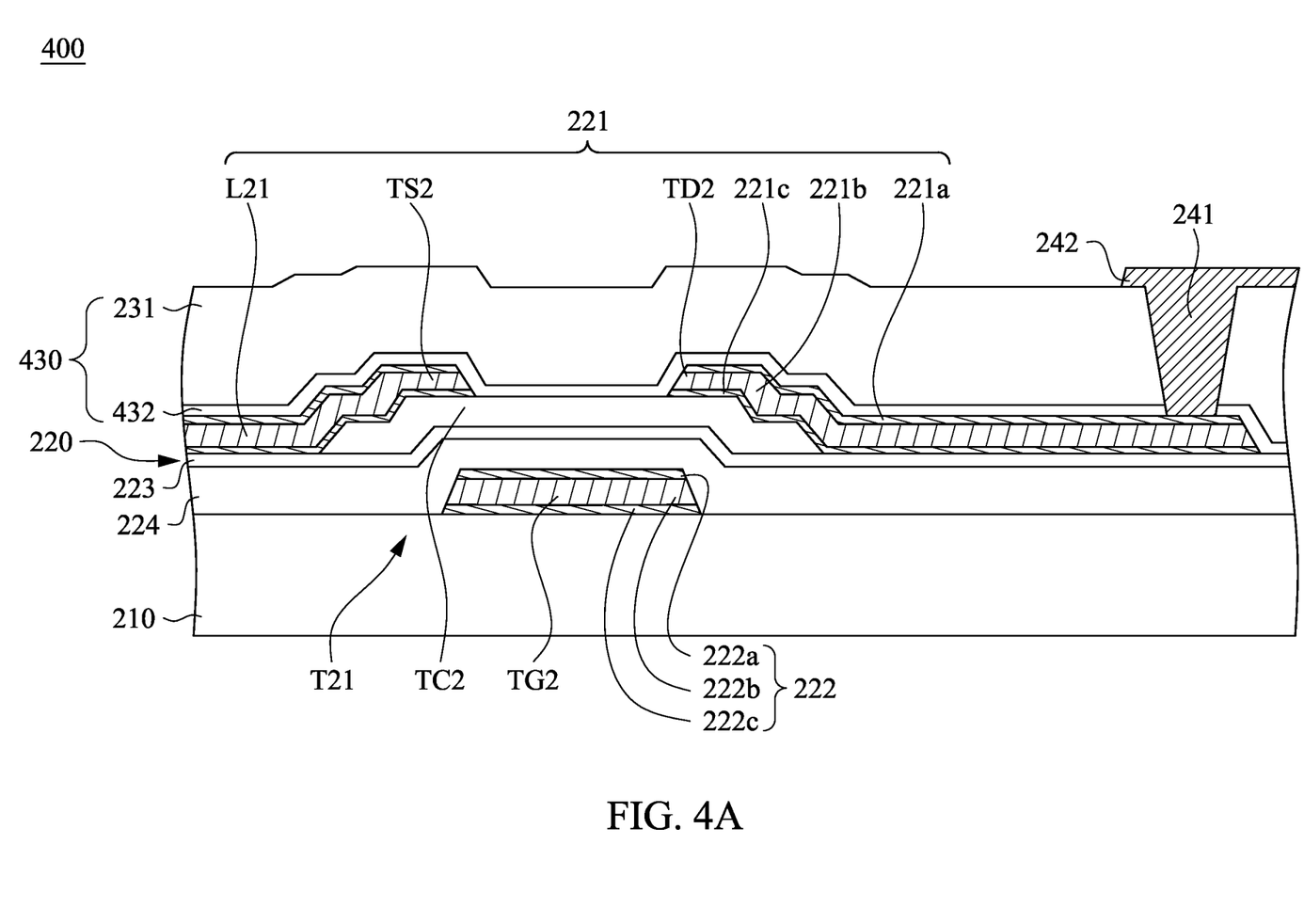
FIGS. 4A and 4B are schematic cross-sectional views of a control substrate of an electronic device according to another embodiment of this disclosure.
Figure 4B:
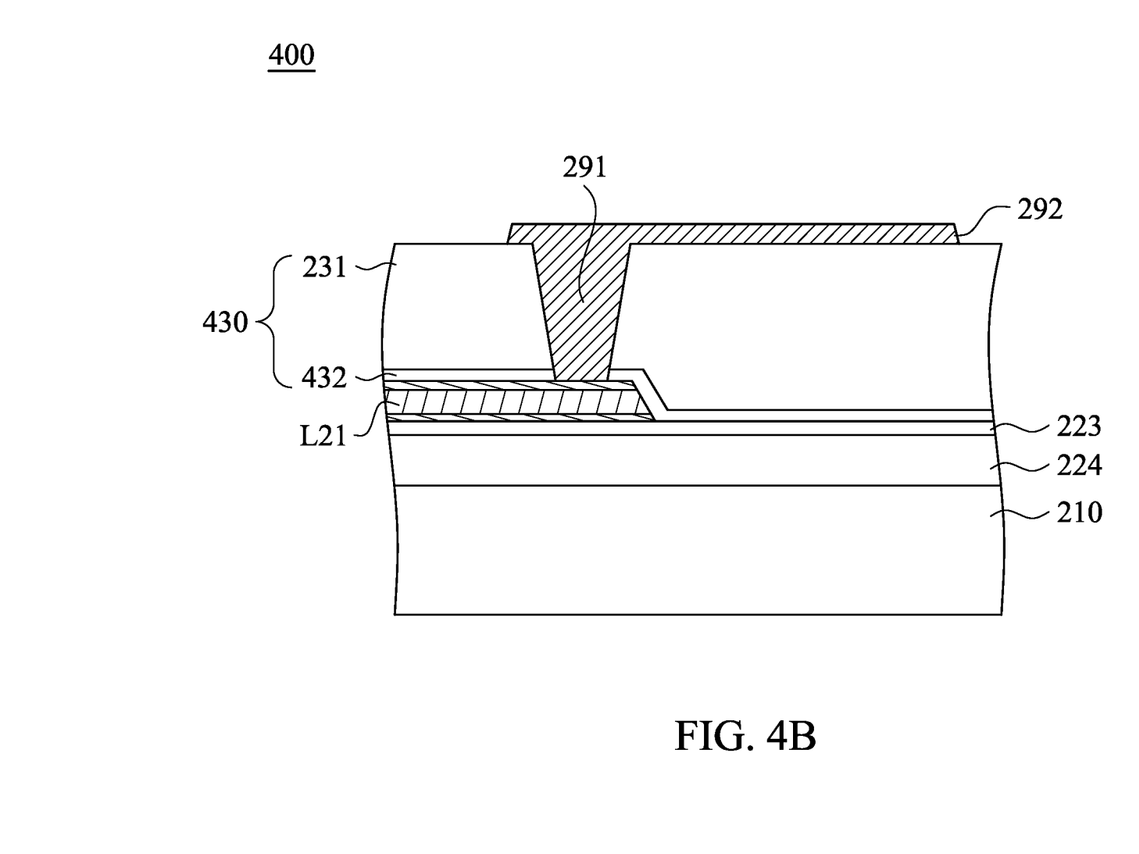

FIGS. 4A and 4B are schematic cross-sectional views of a control substrate of an electronic device according to another embodiment of this disclosure. FIG. 4A is a schematic cross-sectional view of a control substrate 400 within the display area, whereas FIG. 4B is a schematic cross-sectional view of the control substrate 400 within the non-display area. Referring to FIGS. 4A and 4B, the control substrates 400 and 200 are similar, where the difference between the control substrates 400 and 200 is a passivation layer 430 included in the control substrate 400.

Specifically, in the embodiment as shown in FIGS. 4A and 4B, the passivation layer 430 includes a nitride insulating layer 231 and a oxide insulating layer 432, in which the material of the oxide insulating layer 432 can be the same as the material of the oxide insulating layer 232. Unlike the oxide insulating layer 232, the oxide insulating layer 432 completely covers the component-array layer 220, i.e., completely covers the insulating layer 223. Accordingly, the part of the oxide insulating layer 432 in contact with the insulating layer 223 can be sandwiched between the nitride insulating layer 231 and the insulating layer 223, as shown in FIGS. 4A and 4B.

It is noted that the electronic device 100 disclosed in the above embodiment is illustrated with a display device, for example. However, in other embodiment, the electronic device 100 also can be another device, such as a touch sensing panel or an image sensor. Hence, the electronic device 100 is not limited to a display device, and the previous first wiring layer 221 and the passivation layer 230 (including the nitride insulating layer 231 and the oxide insulating layer 232) also can be used in other device except display device, such as the touch sensing panel or the image sensor.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An electronic device, comprising:
a substrate;
a first wiring layer, disposed on the substrate and comprising an outer metal layer, wherein the outer metal layer contains at least 97 wt % molybdenum;
an oxide insulating layer, disposed on the first wiring layer and touching the outer metal layer; and
a nitride insulating layer, disposed on the oxide insulating layer, wherein the oxide insulating layer is positioned between the nitride insulating layer and the outer metal layer, and a thickness difference between the thickness of the oxide insulating layer and the thickness of the nitride insulating layer is greater than or equal to 250 nm.

2. The electronic device of claim 1, wherein the thickness of the oxide insulating layer is less than or equal to 50 nm.

3. The electronic device of claim 2, wherein the thickness of the nitride insulating layer is greater than or equal to 300 nm.

4. The electronic device of claim 1, wherein the thickness of the nitride insulating layer is less than or equal to 50 nm.

5. The electronic device of claim 4, wherein the thickness of the oxide insulating layer is greater than or equal to 300 nm.

6. The electronic device of claim 1, wherein the oxide insulating layer is a silicon oxide layer.

7. The electronic device of claim 1, wherein the outer metal layer is a molybdenum layer.

8. The electronic device of claim 1, wherein the outer metal layer is a molybdenum chromium alloy layer.

9. The electronic device of claim 1, wherein the nitride insulating layer is a silicon nitride layer.

10. The electronic device of claim 1, wherein the first wiring layer further comprises:
a first inner metal layer, disposed on the substrate; and
a second inner metal layer, disposed between the first inner metal layer and the outer metal layer.

11. The electronic device of claim 10, wherein a material of the second inner metal layer is different from a material of the outer metal layer.

12. The electronic device of claim 10, further comprising:
a second wiring layer, disposed on the substrate, and positioned between the substrate and the first wiring layer.

13. The electronic device of claim 12, further comprising:
at least one insulating layer, covering the second wiring layer, and positioned between the first wiring layer and the second wiring layer.

14. The electronic device of claim 13, further comprising:
a plurality of semiconductor layers, disposed on the at least one insulating layer, wherein the semiconductor layers and the second wiring layer overlap, and the first wiring layer covers each of the semiconductor layers partially and is electrically connected to the semiconductor layers.

15. The electronic device of claim 14, wherein a material of each of the semiconductor layers is indium gallium zinc oxide.

16. The electronic device of claim 1, further comprising:
a plurality of bonding pads, disposed on the nitride insulating layer and electrically connected to the first wiring layer.

17. The electronic device of claim 1, further comprising:
an imaging part, disposed on the nitride insulating layer; and
an opposite substrate, disposed on the imaging part.

* * * * *